(12) United States Patent
Cretu et al.

(10) Patent No.: US 11,845,654 B2
(45) Date of Patent: Dec. 19, 2023

(54) METHODS OF FABRICATING MICRO ELECTRO-MECHANICAL SYSTEMS STRUCTURES

(71) Applicant: The University of British Columbia, Vancouver (CA)

(72) Inventors: Edmond Cretu, Vancouver (CA); Chang Ge, Vancouver (CA)

(73) Assignee: The University of British Columbia, Vancouver (CA)

( * ) Notice: Subject to any disclaimer, the term of this patent is extended or adjusted under 35 U.S.C. 154(b) by 157 days.

(21) Appl. No.: 17/352,149

(22) Filed: Jun. 18, 2021

(65) Prior Publication Data
US 2021/0395081 A1 Dec. 23, 2021

Related U.S. Application Data

(60) Provisional application No. 63/040,655, filed on Jun. 18, 2020.

(51) Int. Cl.
*B81C 1/00* (2006.01)
(52) U.S. Cl.
CPC .. *B81C 1/00476* (2013.01); *B81C 2201/0105* (2013.01); *B81C 2201/0133* (2013.01);
(Continued)

(58) Field of Classification Search
CPC ........ B81C 1/00476; B81C 2201/0105; B81C 2201/0133; B81C 2201/0143;
(Continued)

(56) References Cited

U.S. PATENT DOCUMENTS

| 4,426,253 A | 1/1984 | Kreuz et al. |
| 2010/0327380 A1* | 12/2010 | Chang ................ B81C 1/00476 257/419 |
| 2020/0137501 A1* | 4/2020 | Piechocinski .......... H04R 1/086 |

OTHER PUBLICATIONS (Photosensitive Poly(DimethySiloxane) (PhotoPDMS) for Rapid and Simple Polymer Fabrication), International Conference on Solid State Sensors and Actuators (Transducers), Jun. 10-14, 2007) (Year: 2007).*

(Continued)

*Primary Examiner* — Yasser A Abdelaziez
(74) *Attorney, Agent, or Firm* — SEED INTELLECTUAL PROPERTY LAW GROUP LLP

(57) ABSTRACT

According to at least one embodiment, a method of fabricating a micro electro-mechanical systems (MEMS) structure is disclosed. The method involves causing an etchant to remove a portion of a sacrificial layer of the MEMS structure, the sacrificial layer between a structural layer of the MEMS structure and a substrate of the MEMS structure. In this embodiment, causing the etchant to remove the portion of the sacrificial layer involves causing a target portion of the substrate to be released from the MEMS structure. According to another embodiment, another method of fabricating a MEMS structure is disclosed. The method involves causing an etchant including water to remove a portion of a sacrificial layer of the MEMS structure, the sacrificial layer between a structural layer of the MEMS structure and a substrate of the MEMS structure. In this embodiment, the sacrificial layer and the substrate are hydrophobic.

21 Claims, 15 Drawing Sheets

(52) U.S. Cl.
CPC ............... B81C 2201/0143 (2013.01); B81C 2201/0181 (2013.01)

(58) Field of Classification Search
CPC .... B81C 2201/0181; B81C 2201/0107; B81C 2201/0108
See application file for complete search history.

(56) References Cited

OTHER PUBLICATIONS

Abgrall et al., "SU-8 as a structural material for labs-on-chips and microelectromechanical systems," *Electrophoresis* 28:4539-4551, 2007.
Berger et al., "Capacitive pressure sensing with suspended graphene-polymer heterostructure membranes," *Nanoscale* 9:17439, 2017.
Bertsch et al., "Special Issue: 15 Years of SU8 as MEMS Material," *Micromachines* 6:790-792, 2015.
Chang et al., "A Novel Method for Fabricating Sonic Paper," 2007 IEEE Ultrasonics Symposium, IEEE, 2007, pp. 527-530.
Chiriacó et al., "Fabrication of interconnected multilevel channels in a monolithic SU-8 structure using a LOR sacrificial layer," *Microelectronic Engineering* 164:30-35, 2016.
Chong et al., "Capacitive Micromachined Ultrasonic Transducer (CMUT) with Graphene Membrane," 2016 IEEE International Ultrasonics Symposium Proceedings, IEEE, 2016, 4 pages.
Dai et al., "Design and fabrication of a SU-8 based electrostatic microactuator," *Microsyst Technol* 13:271-277, 2007.
Dai et al., "Fabrication of comb-drive micro-actuators based on UV lithography of SU-8 and electroless plating technique," *Microsyst Technol* 14:1745-1750, 2008.
Delhaye et al., "One-Day Fast Prototyping Process for Functionalized Membrane Array on Flexible Substrate," Poster, Sep. 2019, 2 pages.
Dellmann et al., "Fabrication process of high aspect ratio elastic and SU-8 structures for piezoelectric motor applications," *Sensors and Actuators A* 70:42-47, 1998.
Feng et al., "The characterization of thermal and elastic constants for an epoxy photoresist SU8 coating," *Journal of Materials Science* 37:4793-4799, 2002.
Ge et al., "MEMS transducers low-cost fabrication using SU-8 in a sacrificial layer-free process," *Journal of Micromechanics and Microengineering* 27:045002, 2017. (11 pages).
Ge et al., "Design and fabrication of SU-8 CMUT arrays through grayscale lithography," *Sensors and Actuators A* 280:368-375, 2018.
Ge et al., "A sacrificial-layer-free fabrication technology for MEMS transducer on flexible substrate," *Sensors and Actuators A* 286:202-210, 2019.
Ge et al., "A Simple and Robust Fabrication Process for SU-8 In-Plane MEMS Structures," *Micromachines* 11:317, 2020. (16 pages).
Gerardo et al., "Fabrication and testing of polymer-based capacitive micromachined ultrasound transducers for medical imaging," *Microsystems & Nanoengineering* 4:19, 2018. (12 pages).
Huff et al., "Chapter 14: MEMS Process Integration," in *MEMS Materials and Processes Handbook*, eds. Ghodssi et al., 2011, pp. 1045-1181.
Joseph et al., "A Low Pull-in SU-8 based Capacitive Micromachined Ultrasonic Transducer for Medical Imaging Applications," IEEE, 2014, pp. 1398-1401.
Joseph et al., "Fabrication of SU-8 Based Capacitive Micromachined Ultrasonic Transducer for Low Frequency Therapeutic Applications," IEEE, 2015, pp. 1365-1368.
Lau et al., "Fast electrothermally activated micro-positioner using a high-aspect-ratio micro-machined polymeric composite," *Applied Physics Letters* 101:033108, 2012. (5 pages).
Liu, "Recent Developments in Polymer MEMS," *Adv. Mater.* 19:3783-3790, 2007.
Lorenz et al., "SU-8: a low-cost negative resist for MEMS," *J. Micromech. Microeng.* 7:121-124, 1997.
Mäki et al., "Modeling and Experimental Characterization of Pressure Drop in Gravity-Driven Microfluidic Systems," *Journal of Fluids Engineering* 137:021105-1, 2015. (8 pages).
Medgyes et al., "Measurements of Water Contact Angle on FR4 and Polyimide Substrates Relating Electrochemical Migration," 36th Int. Spring Seminar on Electronics Technology, IEEE, 2013, pp. 157-160.
Oliveira et al., "MEMS-Based Ultrasound Transducer: CMUT Modeling and Fabrication Process," *ECS Transactions* 49(1):431-438, 2012.
Roch et al., "Fabrication and characterization of an SU-8 gripper actuated by a shape memory alloy thin film," *Journal of Micromechanics and Microengineering* 13:330-336, 2003.
Tadayon et al., "Optical Micromachined Ultrasound Transducers (OMUT)—A New Approach for High-Frequency Transducers," *IEEE Transactions on Ultrasonics, Ferroelectrics, and Frequency Control* 60(9):2021-2030, 2013.
Voicu et al., "Nonlinear numerical analysis and experimental testing for an electrothermal SU-8 microgripper with reduced out-of-plane displacement," *IOP Conf. Series: Journal of Physics: Conf. Series* 922:012006, 2017. (7 pages).
Walther et al., "Stability of the hydrophilic behavior of oxygen plasma activated SU-8," *Journal of Micromechanics and Microengineering* 17:524-531, 2007.
Wang et al., "Arrayed SU-8 polymer thermal actuators with inherent real-time feedback for actively modifying MEMS' substrate warpage," *Journal of Micromechanics and Microengineering* 26:095011, 2016. (11 pages).
Zhang et al., "An Optically Transparent Capacitive Micromachined Ultrasonic Transducer (CMUT) Fabricated Using SU-8 or BCB Adhesive Wafer Bonding," IEEE, 2017. (4 pages).
Zhao et al., "Fabrication of high-aspect-ratio polymer-based electrostatic comb drives using the hot embossing technique," *Journal of Micromechanics and Microengineering* 13:430-435, 2003.

\* cited by examiner

METHODS OF FABRICATING MICRO ELECTRO-MECHANICAL SYSTEMS STRUCTURES

CROSS-REFERENCE TO RELATED APPLICATION

This application claims the benefit of, and priority to, U.S. provisional patent application No. 63/040,655 filed Jun. 18, 2020, the entire contents of which are incorporated by reference herein.

FIELD

This disclosure relates generally to methods of fabricating micro electro-mechanical systems structures.

RELATED ART

Known methods of fabricating micro electro-mechanical systems (MEMS) structures may be overly complex and time-consuming.

SUMMARY

According to at least one embodiment, there is disclosed a method of fabricating a micro electro-mechanical systems (MEMS) structure, the method comprising causing an etchant to remove a portion of a sacrificial layer of the MEMS structure, the sacrificial layer between a structural layer of the MEMS structure and a substrate of the MEMS structure, wherein causing the etchant to remove the portion of the sacrificial layer comprises causing a target portion of the substrate to be released from the MEMS structure.

In some embodiments, the method further comprises removing at least part of a thickness of a border portion of the substrate before causing the etchant to remove the portion of the sacrificial layer, the border portion of the substrate adjacent to the target portion of the substrate.

In some embodiments, removing at least part of the thickness of the border portion of the substrate comprises removing all of the border portion of the substrate.

In some embodiments, only the sacrificial layer connects the target portion of the substrate to the MEMS structure after removing all of the border portion of the substrate and before causing the etchant to remove the portion of the sacrificial layer.

In some embodiments, the border portion of the substrate surrounds the target portion of the substrate.

In some embodiments, removing the border portion of the substrate comprises causing a laser to remove the border portion of the substrate.

In some embodiments, the method further comprises depositing the structural layer onto the sacrificial layer.

In some embodiments, the method further comprises depositing the structural layer onto the sacrificial layer after removing the at least part of the thickness of the border portion of the substrate and before causing the etchant to remove the portion of the sacrificial layer.

In some embodiments, the method further comprises removing a portion of the structural layer.

In some embodiments: the structural layer comprises a photosensitive polymer; and removing the portion of the structural layer comprises using photolithography to remove the portion of the structural layer.

In some embodiments: the etchant comprises water; and the sacrificial layer and the substrate are hydrophobic.

In some embodiments, removing the portion of the structural layer comprises removing the portion of the structural layer without removing an active portion of the structural layer, the active portion comprising a microstructure movable relative to the substrate.

According to at least one embodiment, there is disclosed a method of fabricating a micro electro-mechanical systems (MEMS) structure, the method comprising causing an etchant comprising water to remove a portion of a sacrificial layer of the MEMS structure, the sacrificial layer between a structural layer of the MEMS structure and a substrate of the MEMS structure, wherein the sacrificial layer and the substrate are hydrophobic.

In some embodiments, removal of the portion of the sacrificial layer creates a structural layer overhang resulting from etching between the structural layer and the substrate that is limited by hydrophobicity of the sacrificial layer and the substrate.

In some embodiments, the method further comprises depositing a conductive layer onto the structural layer after causing the etchant to remove the portion of the sacrificial layer.

In some embodiments, depositing the conductive layer onto the structural layer comprises tilted magnetron sputtering.

In some embodiments, depositing the conductive layer onto the structural layer comprises depositing the conductive layer onto the structural layer such that a covered part of an inner surface of the substrate exposed during removal of the sacrificial layer is masked from metal deposition by the structural layer overhang, creating a break in the conductive layer.

In some embodiments: the structural layer is an electrical insulator; and the break in the conductive layer creates an open circuit.

In some embodiments, the method further comprises removing a portion of the structural layer without removing an active portion of the structural layer, the active portion comprising a microstructure movable relative to the substrate.

In some embodiments: the contact angle of water on the structural layer is at least 90 degrees; the contact angle of water on the substrate is at least 80 degrees; and the sacrificial layer has a thickness of about 25 microns.

Other aspects and features will become apparent to those ordinarily skilled in the art upon review of the following description of illustrative embodiments in conjunction with the accompanying figures.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

DETAILED DESCRIPTION

Micro electro-mechanical systems (MEMS) consist of sensors and actuators transferring information and energy between the electrical and mechanical domains. Methods of fabricating MEMS structures involving a substrate, a sacrificial layer, and a structural layer are described herein.

Figure 1:
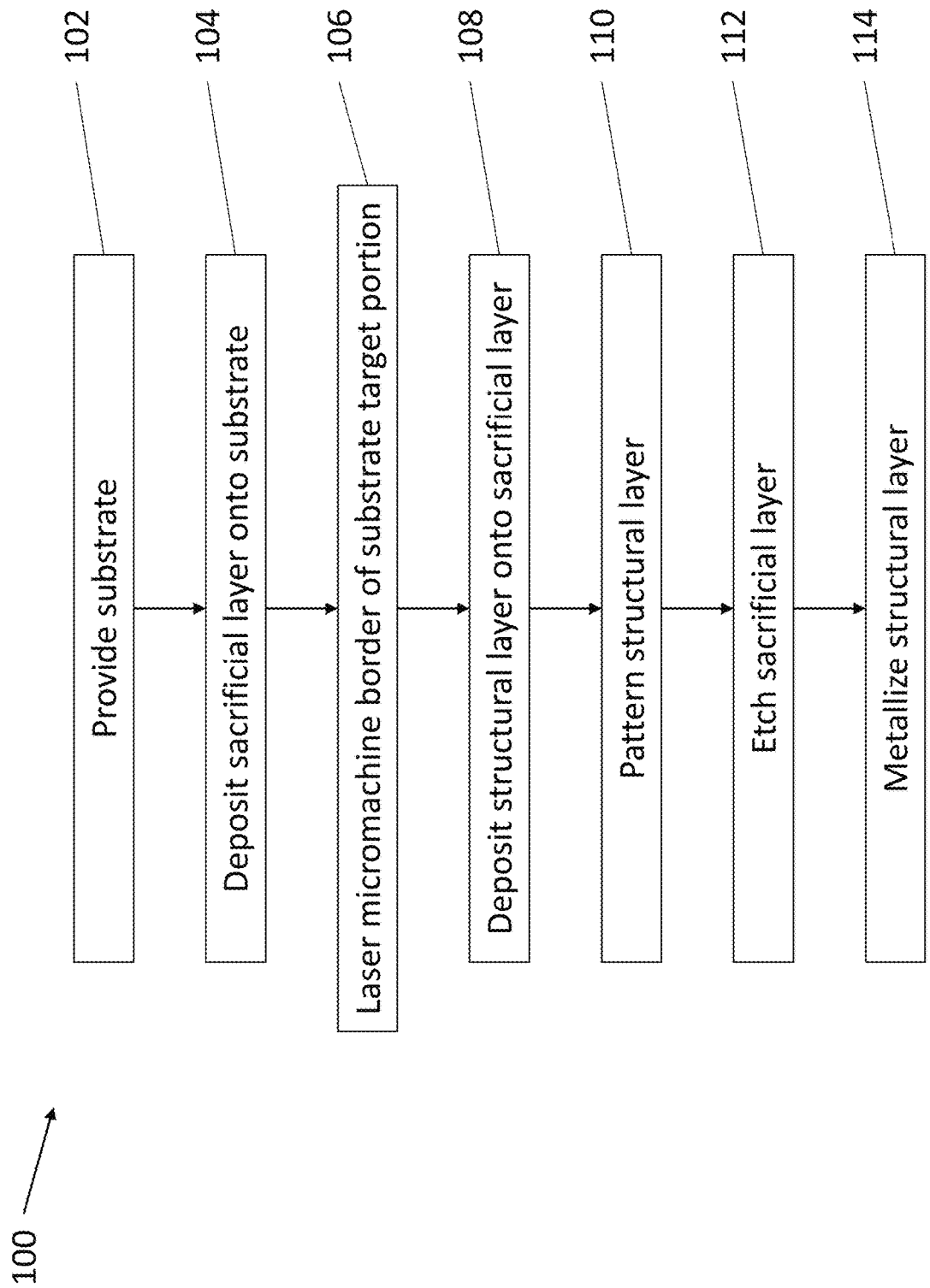
FIG. 1 is a flow chart of a method of fabricating micro electro-mechanical systems (MEMS) structures according to one embodiment.
Figure 2:
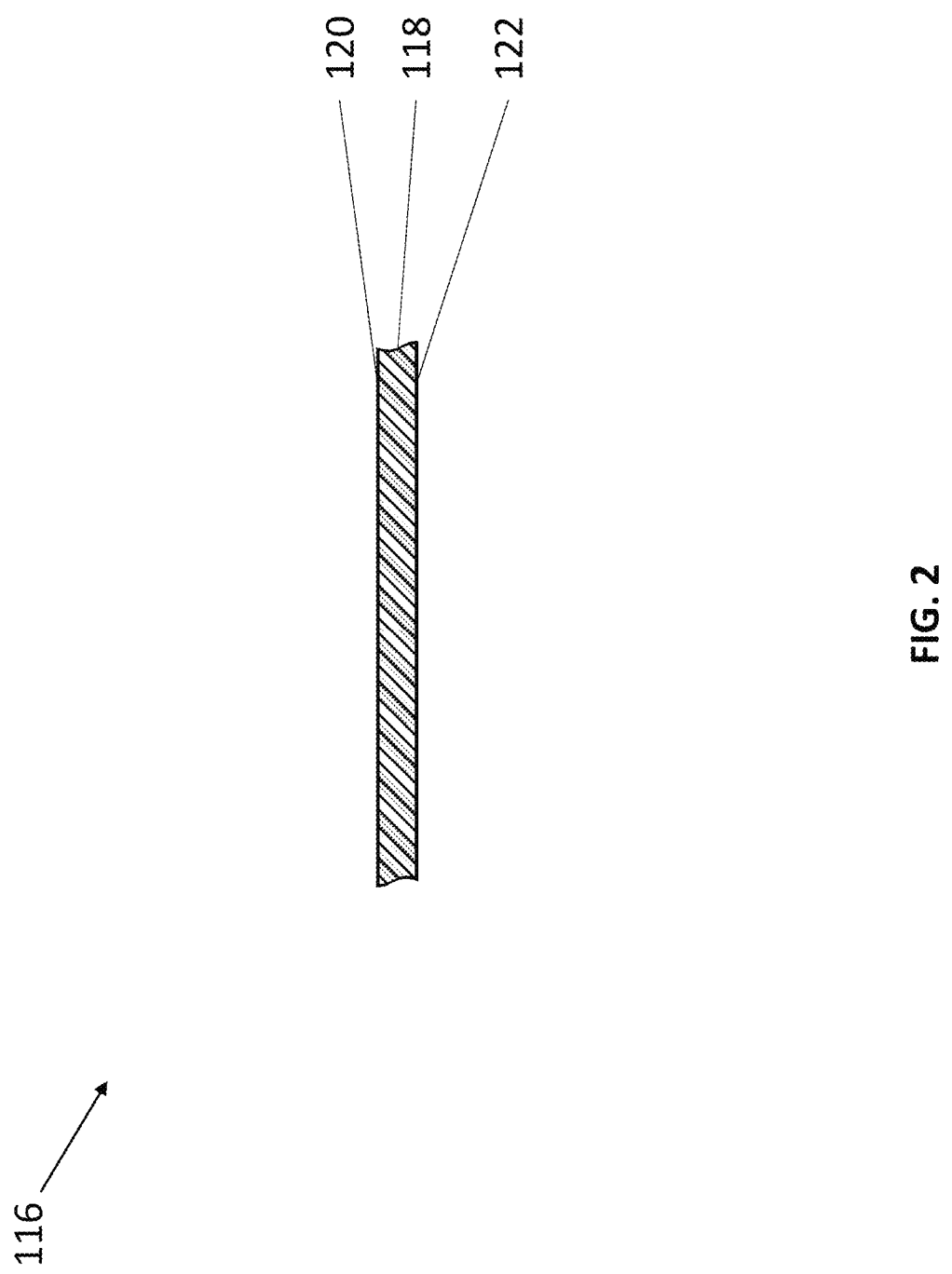
FIG. 2 is a cross-sectional view of a MEMS structure at an intermediate fabrication process stage being fabricated according to the method of FIG. 1.

Referring to FIGS. 1 and 2, a method of fabricating a MEMS structure according to one embodiment is illustrated in a flowchart shown generally at 100, and a region of a MEMS structure being fabricated according to the method illustrated in the flowchart 100 is shown generally at 116. In a first step of the method of this embodiment, at 102, a substrate 118 is provided. The substrate 118 includes an inner surface 120 and an outer surface 122. In some embodiments, the substrate 118 may include a polyimide such as, for example, Kapton™.

Figure 3:
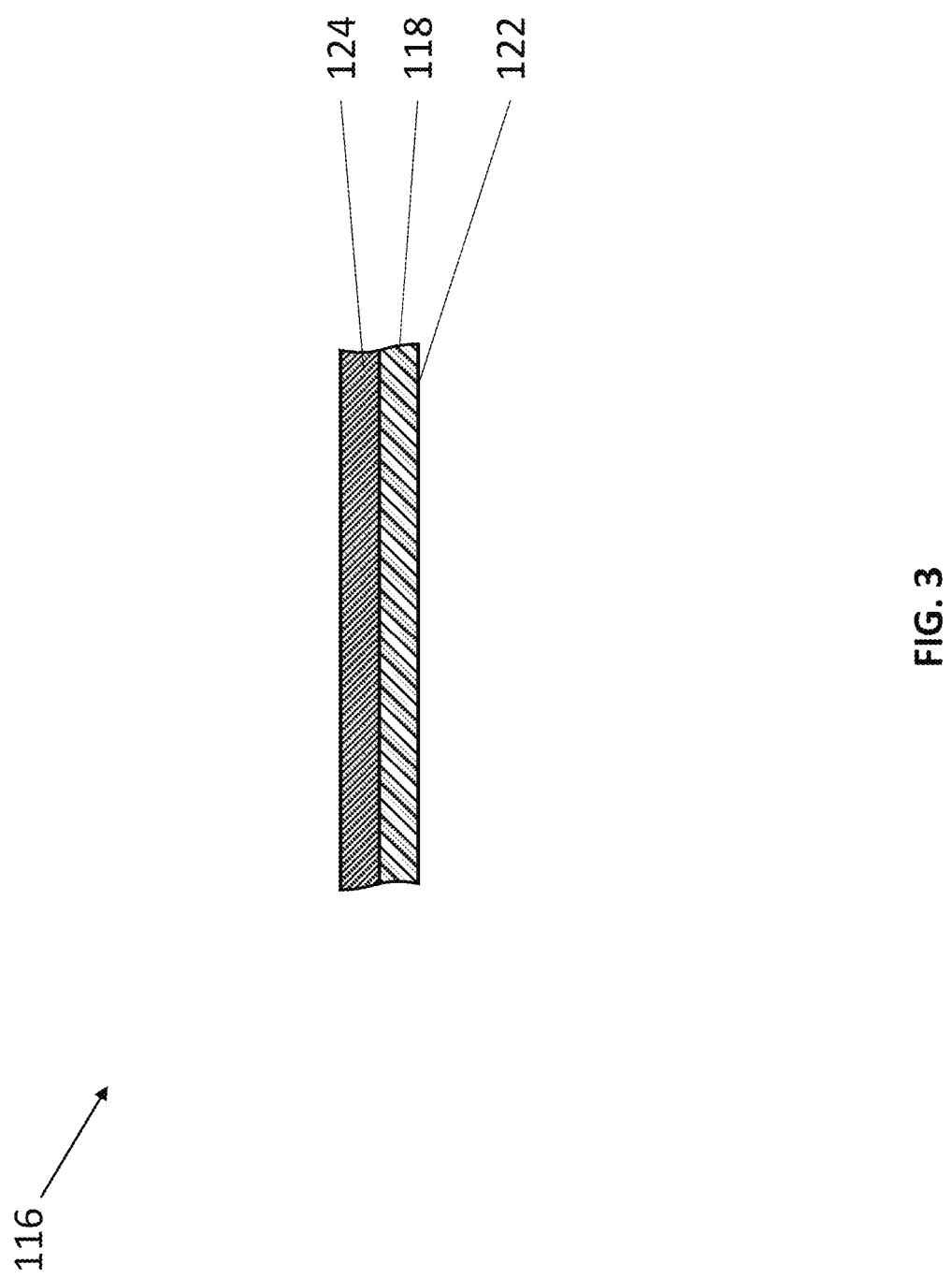
FIG. 3 is a cross-sectional view of the MEMS structure of FIG. 2 being further fabricated according to the method of FIG. 1.

Referring now to FIGS. 1 and 3, at 104, a sacrificial layer 124 is deposited onto the inner surface 120 of the substrate 118. In some embodiments, the sacrificial layer 124 may include a metallic material, such as, for example, copper. In other embodiments, the sacrificial layer 124 may include a silicic material or a polymeric material. The sacrificial layer 124 may also be referred to as a "release layer" and, in general, may include one or more materials that may be etched by an etchant.

Figure 4:
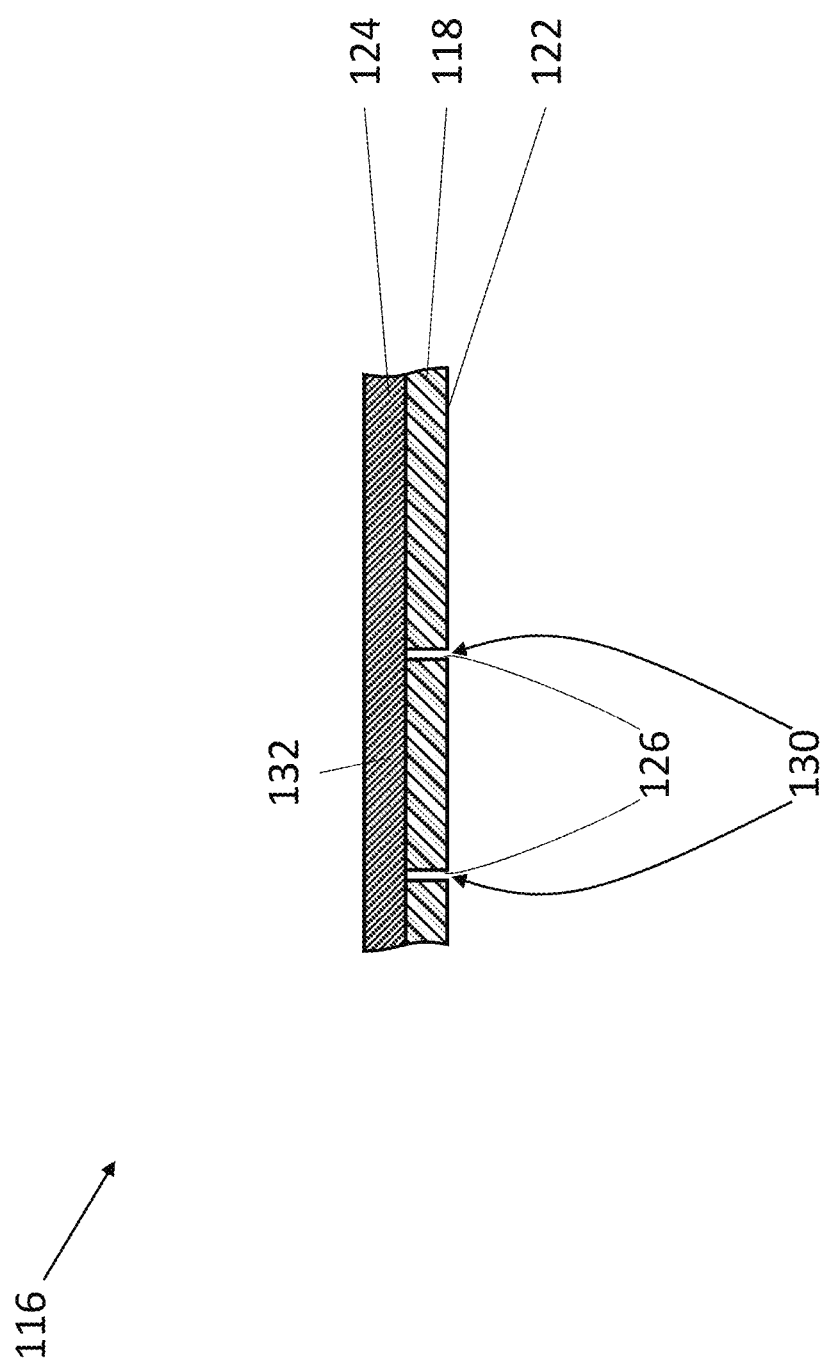
FIG. 4 is a cross-sectional view of the MEMS structure of FIG. 3 being further fabricated according to the method of FIG. 1.
Figure 5:
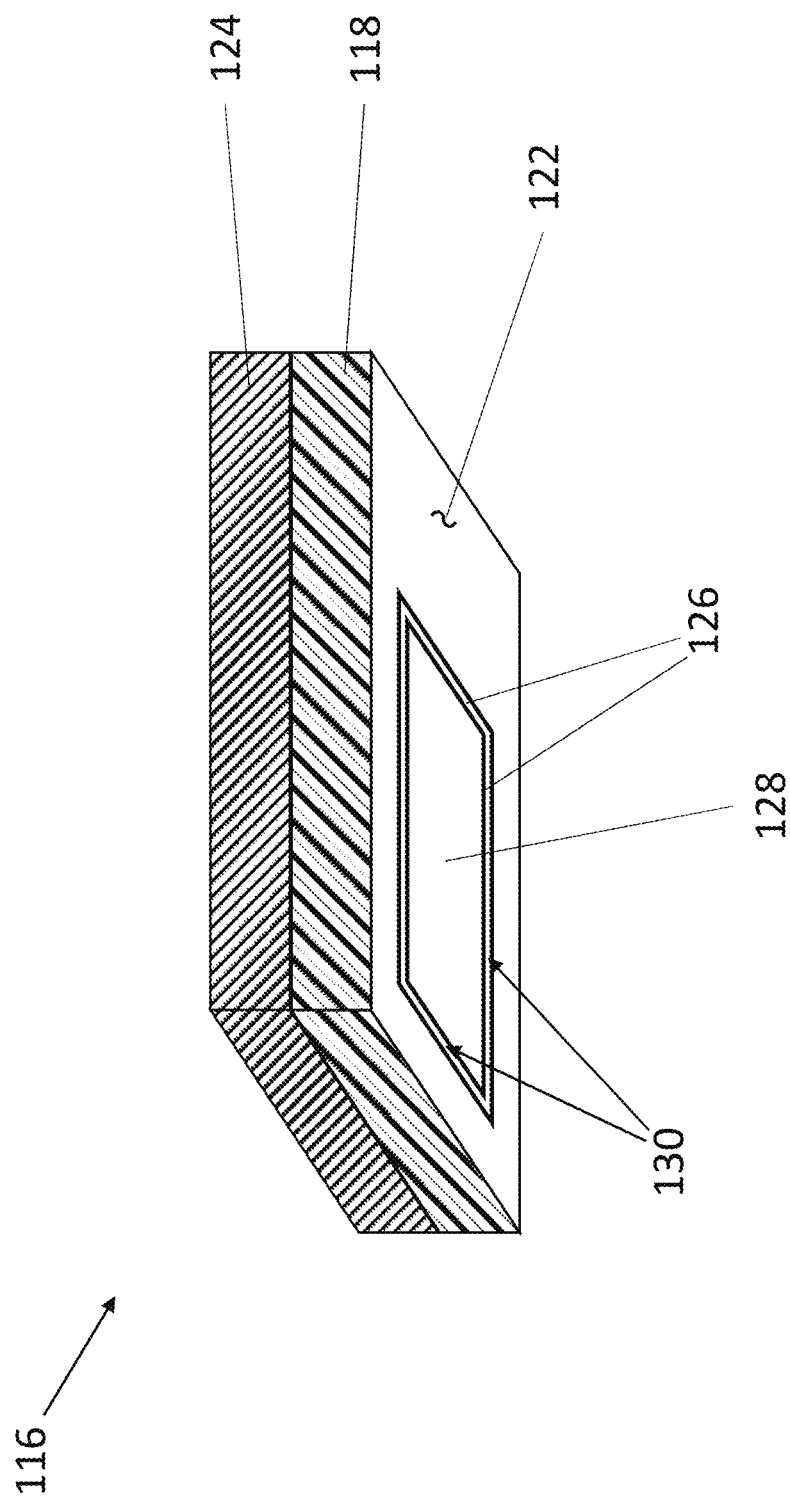
FIG. 5 is a perspective view of the MEMS structure of FIG. 4.

Referring to FIGS. 1, 4, and 5, at 106, the substrate 118 is ablated using laser micromachining to remove a border portion of the substrate 118 adjacent to and along a border 126 of a target portion 128 of the substrate 118. Removal of the border portion produces a cavity, shown generally at 130, in the substrate 118 along the border 126. The target portion 128 of the substrate may also be referred to as an "active area", and the border portion or the cavity 130 may be referred to as defining the target portion 128 or an "active area" of the MEMS structure.

In the embodiment shown, the border portion and thus the cavity 130 surround the target portion 128, and the cavity 130 spans an entire thickness of the substrate 118, between the inner surface 120 and the outer surface 122. As such, the target portion 128 is isolated from a remainder of the substrate 118 and is only connected to the region 116 of the MEMS structure by a retaining portion 132 of the sacrificial layer 124, effectively forming an "island" of substrate outlined by the cavity 130. In some embodiments, the border portion and the resulting cavity 130 may not entirely surround the target portion 128. Also, in some embodiments, the cavity 130 may not span the entire thickness of the substrate 118. That is, in some embodiments, laser micromachining may only partially ablate the substrate 118 along the border 126, such that the resulting cavity 130 only penetrates a part of the thickness of the border portion.

In the embodiment shown, laser micromachining is used to ablate the substrate 118 and to remove the border portion. Where laser micromachining is used, an initial calibration may ensure that the laser micromachining affects only the substrate 118 and not the sacrificial layer 124. An example of such a calibration is described below for a substrate 118 comprising polyimide and a sacrificial layer 124 comprising copper. In other embodiments, other means may be used to remove the border portion of the substrate 118. For example, in some alternative embodiments, dry etching methods like deep reactive ion etching (DRIE) may be used to remove the border portion. In other alternative embodiments, wet etching methods may be used to remove the border portion. For example, wet etching may be used in combination with photopatterning to remove the border portion. As a more specific example, a photoresist layer may be deposited onto the outer surface 122 of the substrate 118 and then patterned to expose only the border portion of the substrate 118; following this, the substrate may be etched with an etchant selected to etch the substrate 118 without etching the sacrificial layer 124.

Figure 6:
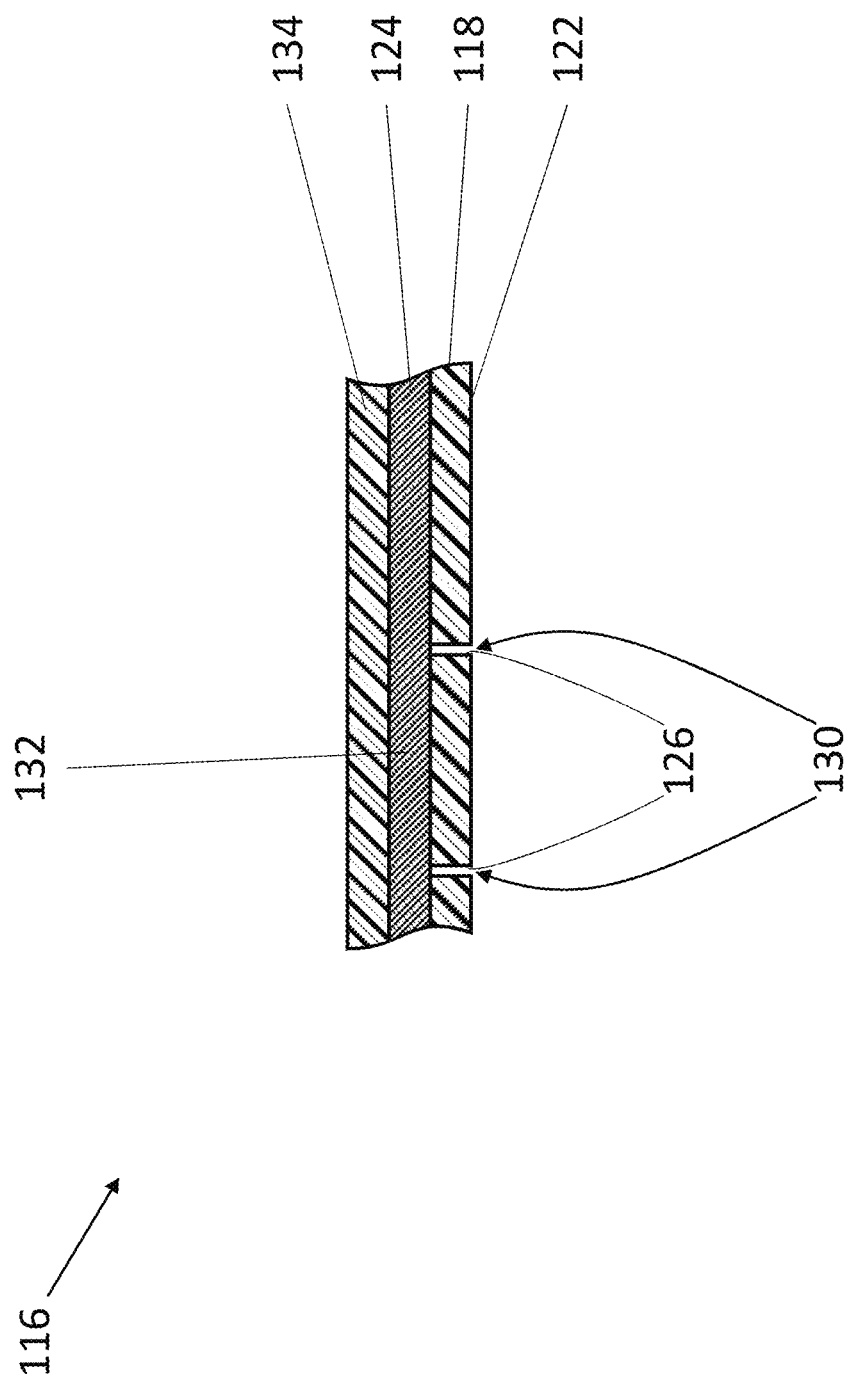
FIG. 6 is a cross-sectional view of the MEMS structure of FIG. 4 being further fabricated according to the method of FIG. 1.
Figure 7:
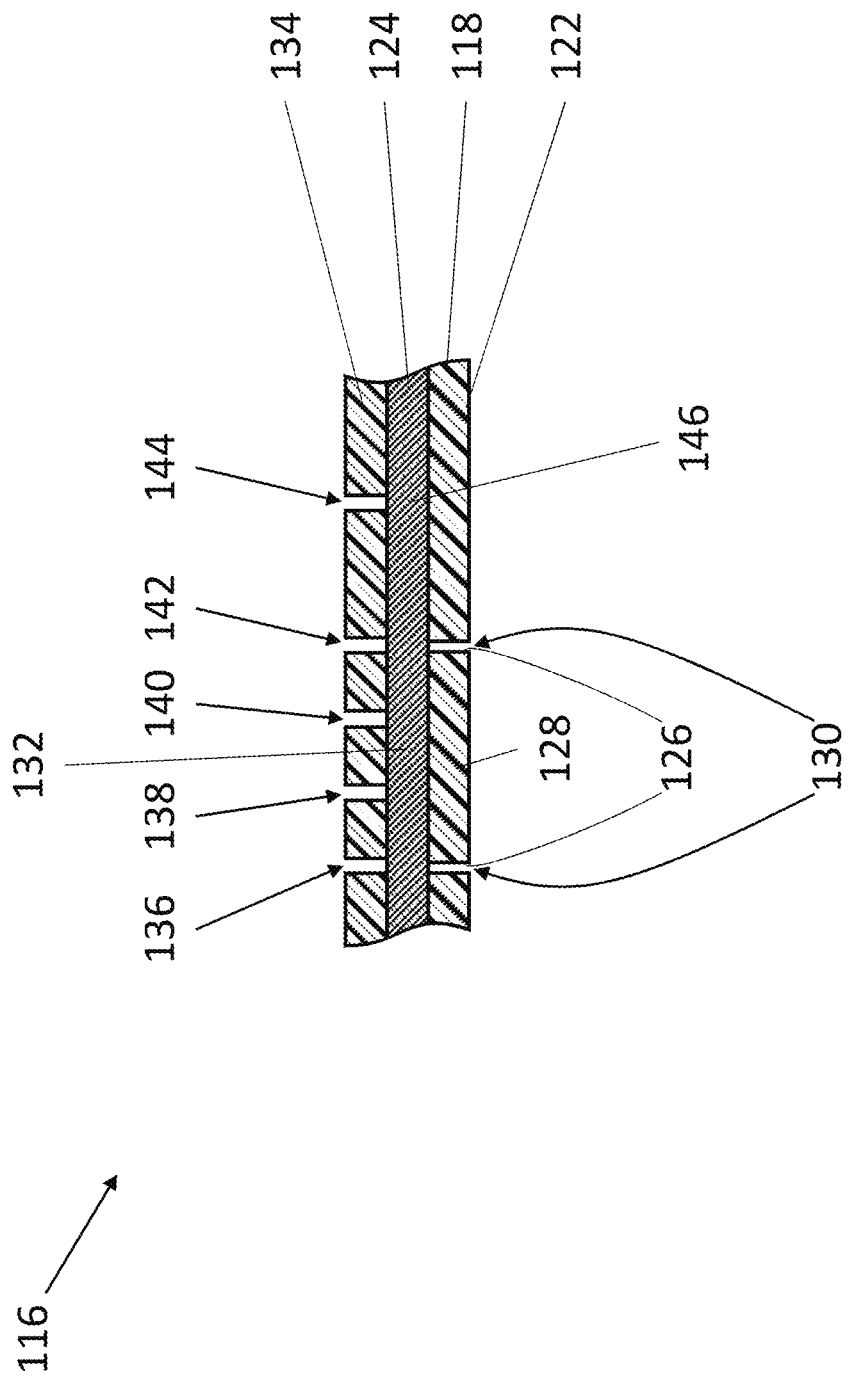
FIG. 7 is a cross-sectional view of the MEMS structure of FIG. 6 being further fabricated according to the method of FIG. 1.

Referring to FIGS. 1, 6, and 7, at 108, a structural layer 134 is deposited onto the sacrificial layer 124. Subsequently, at 110, the structural layer 134 is patterned, that is, one or more portions of the structural layer 134 are removed to produce one or more gaps in the structural layer 134, such as gaps shown generally at 136, 138, 140, 142, and 144. In the embodiment shown, the gaps 136, 138, 140, and 142 are generally aligned with—that is, vertically above as shown in FIG. 7—the target portion 128 of the substrate 118. In other words, the gaps 136, 138, 140, and 142 are within the active area of the MEMS structure. The gap 144 is not within the active area and is instead aligned with an exposed portion 146 of the sacrificial layer 124.

In some embodiments, the structural layer 134 may include a photosensitive polymer such as, for example, SU-8. In such embodiments, the structural layer 134 may be patterned using photolithography. Where photolithography is used, an initial calibration may determine resolution limits and optimum exposure dose. An example of such a calibration is described below for a structural layer 134 comprising SU-8 and a sacrificial layer 124 comprising copper. In alternative embodiments, the structural layer 134 may include one or more other materials that may be patterned.

Figure 8:
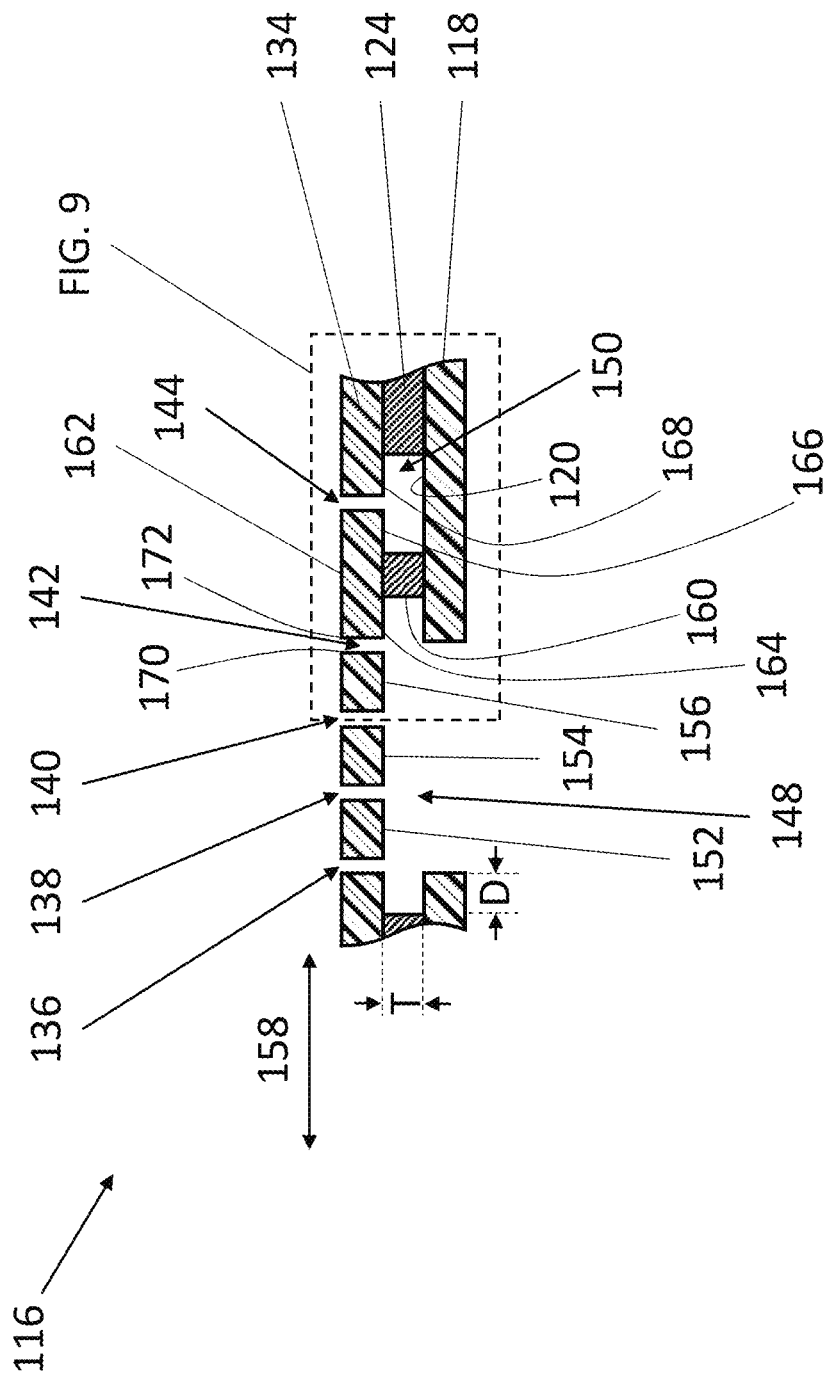
FIG. 8 is a cross-sectional view of the MEMS structure of FIG. 7 being further fabricated according to the method of FIG. 1.

Referring now to FIGS. 1, 7, and 8, at 112, the sacrificial layer 124 is etched using an etchant. The etchant removes the retaining portion 132 and the exposed portion 146 of the sacrificial layer 124 and thus produces first and second breaks, shown generally at 148 and 150, respectively, in the sacrificial layer 124. The etchant may reach the sacrificial layer 124 through the cavity 130 in the substrate 118 and/or through the gaps 136, 138, 140, 142 and 144 in the structural layer 134. In the embodiment shown, the etchant is an aqueous etchant. However, in alternative embodiments, organic etchants or other non-aqueous etchants or liquid etchants may be used. In some embodiments, the etchant may be, for example, ferric chloride water solution.

In the embodiment shown, because the target portion 128 of the substrate 118 is connected to the region 116 of the MEMS structure by only the retaining portion 132 of the sacrificial layer 124, etching of the sacrificial layer 124 and removal of the retaining portion 132 also releases the target portion 128 from the region 116. This approach to removing the target portion 128 of the substrate 118—that is, patterning the substrate 118—may be referred to as "border-bulk release" or "border-removal based release". Because border-removal based release may involve the ablation, etching, or other removal of only the border portion of the substrate 118 (rather than the entire target portion 128), it may require less processing time than other methods of substrate patterning in which an entire target portion must be ablated or etched away.

Etching of the sacrificial layer 124 also releases active portions 152, 154, and 156 of the structural layer 134 between the gaps 136 and 138, 138 and 140, and 140 and 142, respectively. Although the active portions 152, 154, and 156 are no longer supported by the sacrificial layer 124, active portions 152, 154, and 156 remain connected to the structural layer 134. Each of the active portions 152, 154, and 156 may include one or more microstructures movable relative to the substrate 118. For example, the active portion 152 may include one or more in-plane movable microstructures that are movable in a plane parallel to the substrate 118, for example, in a direction 158.

In the embodiment shown, both the substrate 118 and the structural layer 134 are hydrophobic. That is, each of the substrate 118 and the structural layer 134 include hydrophobic surfaces, for example by being formed from one or more hydrophobic materials or by being coated with one or more hydrophobic materials. Because the etchant in the embodiment shown is water-based (or aqueous), hydrophobicity of the substrate 118 and the structural layer 134 limits propagation of the etchant and thus etching of the sacrificial layer 124. As noted above, the etchant accesses the sacrificial layer 124 through the cavity 130 and the gaps 136, 138, 140, 142 and 144. The etchant then propagates laterally away from these openings through the sacrificial layer 124 between the substrate 118 and the structural layer 134 as it removes the retaining portion 132 and the exposed portion 146. This lateral propagation of the etchant is limited to a lateral etching distance D by surface forces that repel the etchant due to the aqueous nature of the etchant and the hydrophobic nature of the substrate 118 and the structural layer 134. The lateral etching distance D is primarily dependent on the hydrophobicity (measured, for example, by water contact angle) of the substrate 118 and of the structural layer 134 and on a thickness T of the sacrificial layer 124. The approach of limiting etching of the sacrificial layer 124 by selection of hydrophobic materials for the substrate 118 and the structural layer 134 may be referred to as "self-limited lateral etching" or "self-limiting lateral etching".

As a result of self-limited lateral etching in the embodiment shown, unetched portions of the sacrificial layer 124 remain after etching is complete. For example, an anchoring portion 160 of the sacrificial layer 124 remains after etching and supports an anchored portion 162 of the structural layer 134. Additionally, self-limited lateral etching produces overhangs of the structural layer 134 over the substrate 118, such as structural layer overhangs 164, 166, and 168.

In the embodiment shown, the structural layer 134 is an electrical insulator. As such, in order to produce a capacitive interface, which may be an in-plane capacitive interface, between movable portions, such as the active portion 156, and fixed portions, such as the anchored portion 162, of the structural layer 134—that is, in order to produce an electromechanical interface—a conductive layer may be deposited over the structural layer 134, including over any internal surfaces, which may be perpendicular to an outer surface of the structural layer 134 or otherwise transverse to the structural layer 134, such as a perpendicular internal surface 170 of the active portion 156 and a perpendicular internal surface 172 of the anchored portion 162.

Figure 9:
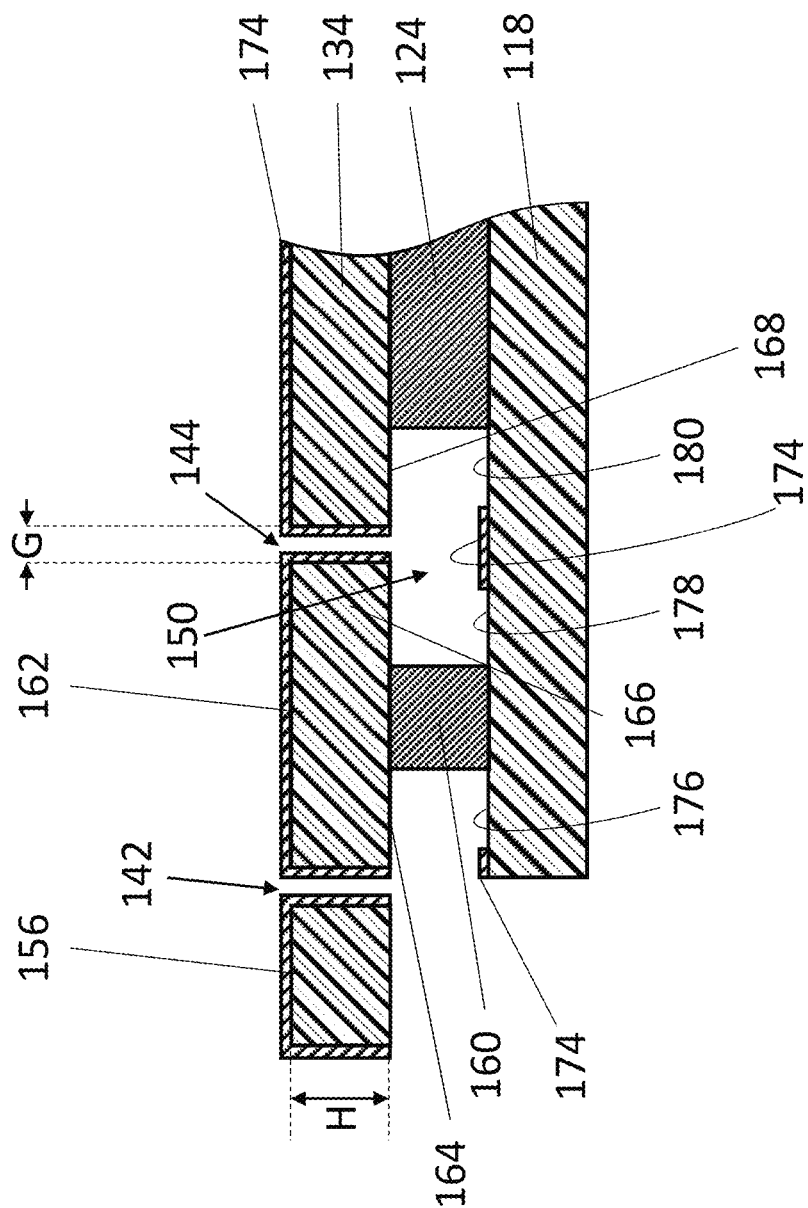
FIG. 9 is a fragmentary cross-sectional view of the MEMS structure of FIG. 8 being further fabricated according to the method of FIG. 1.

Referring now to FIGS. 1, 8, and 9, at 114, a conductive layer 174 is deposited onto the structural layer 134. The conductive layer 174 may be a conformal layer, and may be a metal layer. Therefore, depositing the conductive layer 174 may be referred to as metallization of the structural layer 134. To achieve complete coverage by the conductive layer 174 of internal surfaces (such as the perpendicular internal surfaces 170 and 172) of the structural layer 134, the MEMS structure being fabricated may be tilted during deposition. A tilting angle θ may be computed using:

$$\theta = \arctan\left(\frac{G}{H}\right),$$

where G is a width of a structural layer gap such as the gap 144, and H is a thickness of the structural layer 134. In some embodiments, tilted magnetron sputtering or tilted E-beam evaporation may be used to deposit the conductive layer 174. In some embodiments, the conductive layer 174 may include, for example, aluminum.

Etching of the sacrificial layer 124 and patterning of the structural layer 134 may expose the inner surface 120 of the substrate, for example, through gaps in the structural layer, such as the gaps 142 and 144. As a result, when the conductive layer 174 is deposited onto the structural layer 134, some metal may pass through these gaps in the structural layer 134 and may be deposited onto the substrate 118. In the absence of structural layer overhangs, such as the structural layer overhangs 164, 166, and 168, the conductive layer 174 may be deposited as a continuous layer, thus electrically connecting adjacent separated portions of the structural layer 134, such as the active portion 156 and the anchored portion 162. Such electrical connections would effectively form short-circuits that may produce an unusable MEMS device.

Structural layer overhangs, such as the structural layer overhangs 164, 166, and 168, mask parts of the inner surface 120 of the substrate 118, such as covered parts 176, 178, and 180, from metal deposition, such that no metal is deposited onto them. As a consequence, the conductive layer 174 may not be deposited as a continuous layer; rather, there may be breaks formed in the conductive layer 174 at each of the covered parts 176, 178, and 180. Each of these breaks effectively forms an open circuit, which may allow a functional MEMS device to be produced.

Of course, the embodiment of FIGS. 1 to 9 is an example only, and alternative embodiments may vary. For example, in alternative embodiments, the substrate 118 may be provided with the sacrificial layer 124 in place. As a specific example, a Pyrulax™ copper-polyimide composite (DuPont, Wilmington, DE, USA) may be used as a substrate (with a copper sacrificial layer in place). In other alternative embodiments, the structural layer 134 may be a conductor rather than an insulator such that metallization of the structural layer 134 may not be required.

The following non-limiting examples are illustrative of embodiments of the present disclosure.

In the following examples, a Pyrulax™ copper-polyimide composite was used for the substrate layer 118 (polyimide) and the sacrificial layer 124 (copper), and a photosensitive polymer, SU-8, was used for the structural layer 134. The Pyrulax™ composite consists of a 45 µm thick polyimide layer and a 25 µm thick copper layer. A 75 µm thick SU-8 2050 layer was used. The contact angle of water is 90° on SU-8 and 80° on polyimide. Laser micromachining of the polyimide was performed using an Oxford™ laser micromachining system (wavelength: 355 am, Oxford Lasers, Shirley, MA, USA). SU-8 lithography was conducted using an Advanced Micro Patterning™ SF-100 maskless lithography system (equipment resolution: 0.6 um, labeled output intensity @ 365 nm: 10 mW/cm$^2$, Advanced Micro Patterning LLC, Delray Beach, FL, USA).

Example 1

Calibration of Laser Micromachining

An experimental calibration for laser micromachining on polyimide was performed. During the example calibration process, a relative output power of the laser was fixed at 85%, while a moving speed of the laser dot was set at 1 mm/s. A set of 500 µm (diameter) circular plates cut into the polyimide were used as calibration test structures, each with a different number of laser cut cycles, so that an optimum number of cycles could be identified (optimum in the sense that the polyimide layer is completely cut through without affecting the copper layer). After laser micromachining, the processed samples were immersed in a copper etchant. Performance was evaluated based on a criterion of visual detection of disconnection of the circular plates from the rest of the polyimide film.

In this example, it was found that both the copper layer and the polyimide layer would be penetrated when the laser cut was repeated 12 times. When the laser cut was repeated 6 times, the profile of the polyimide circular plates became significantly blackened. When the laser cut was repeated more than 6 times, the corresponding circular plates were disconnected from the rest of the substrate. Thus, cutting more than 6 was found to have penetrated the polyimide layer, reaching the copper layer. It was concluded that the blackened profile observed after 6 laser cuts could be used as an indication for the penetration of the polyimide layer.

Example 2

Calibration of SU-8 Lithography

An experimental calibration for SU-8 lithography on copper was performed. Parameters used in this example for soft baking, post-exposure baking, and the developing process of 75 µm SU-8 2050 are summarized in Table 1.

TABLE 1

Processing parameters of the 75 µm SU-8 2050 for experimental validation.

| Soft Baking | | Post-Exposure Baking | | Developing |
| --- | --- | --- | --- | --- |
| 65° C. | 95° C. | 65° C. | 95° C. | 6 min (Immersion |
| 3 min | 5 min | 3 min | 5 min | in SU-8 developer) |

In this example, exposure duration was used as a calibrated parameter, ranging from 5 seconds to 10 seconds, with 0.2-second increments. As a commonly practiced method for parameter-controlled microfabrication, the processing parameters in Table 1, once calibrated, were also used in actual fabrication processes.

Figure 10:
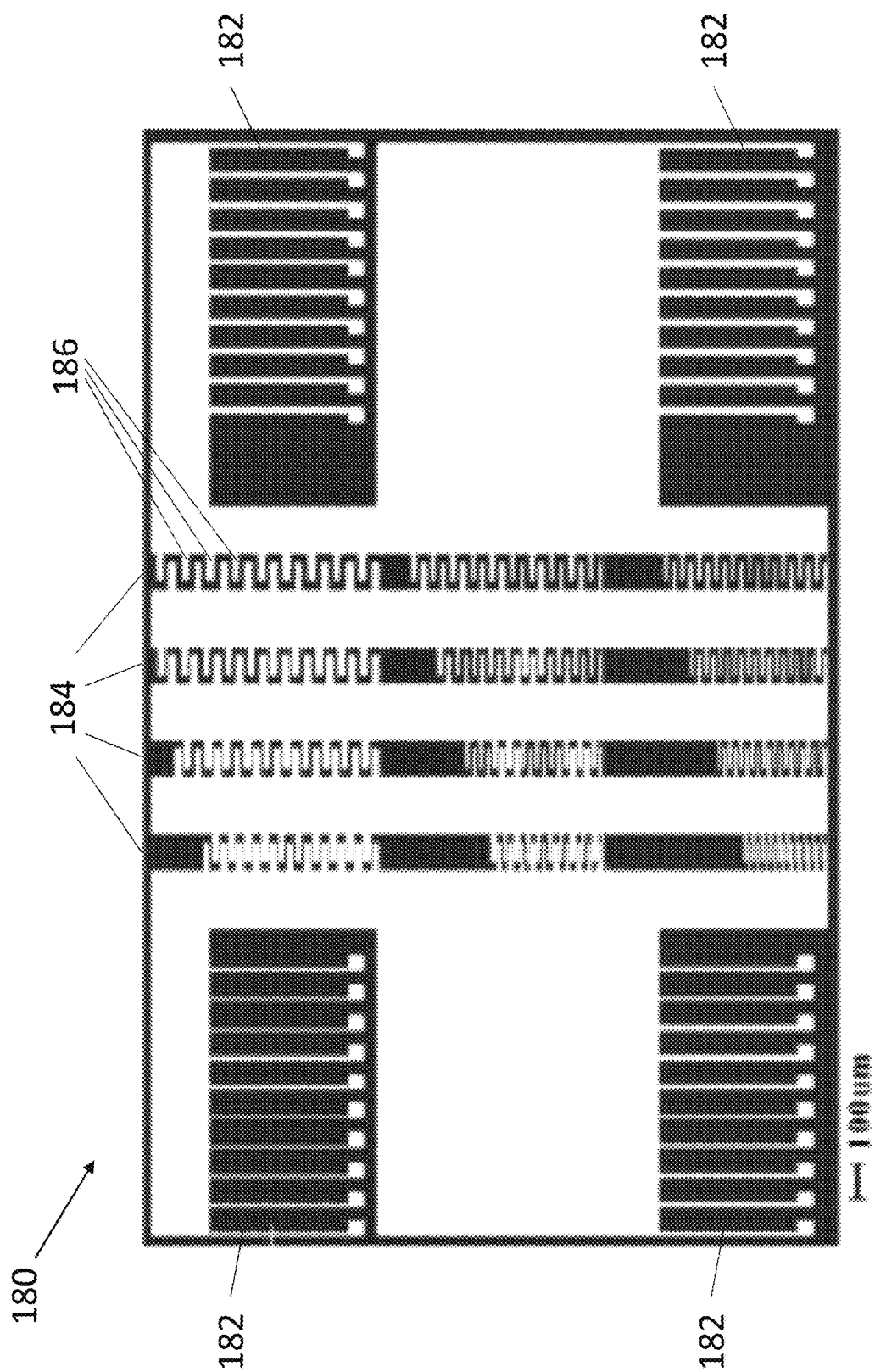
FIG. 10 illustrates a mask design for a SU-8 lithography calibration process according to one embodiment.

Referring to FIG. 10, a calibration mask design, shown generally at 180, was used for the calibration. White pixels in FIG. 10 were exposed to UV radiation. Long beams 182 in FIG. 10 have a constant length of 400 µm, while their widths vary from 5 µm to 20 µm. A calibration target was to get a minimum width for non-distorted beam structures, primitive elements that can serve as springs in a proof-of-concept design. Comb drives 184 in FIG. 10, forming an area-varying capacitive interface, have a constant length of 125 µm, while their width varies from 5 µm to 20 µm. For each width value, four gap distance values, 10 µm, 15 µm, 20 µm, and 25 µm, were used to space comb drive fingers 186 and to determine a minimum achievable gap.

In this example, it was found that exposure durations between 7 to 8 seconds could provide the most balanced results between structural quality (no deformation) and lithography resolution. The first designed gap distance that led to a robust separation between the comb fingers was 20 µm; nevertheless, there is a gap narrowing effect of 5 µm from each finger side, resulting in a nominal gap distance of 10 µm. For fabrication technology of in-plane capacitive MEMS structures, the minimum achievable gap between parallel plates is an important criterion for the process capability. The 10 µm minimum gap obtained in this example compares favorably with minimum achievable gap distances obtained by other polymer-based technologies for in-plane MEMS devices. A width value of 20 µm was found to be the most robust design for the long beams 182.

Example 3

Fabrication of Simple In-Plane SU-8 MEMS Structures

In this example, a simple in-plane SU-8 capacitive MEMS test structure was fabricated. A mask design for the example test structure is shown in FIGS. 11 to 15. A 30 mm by 33.4 mm Pyrulax™ composite was used as a substrate in this example.

Figure 11:
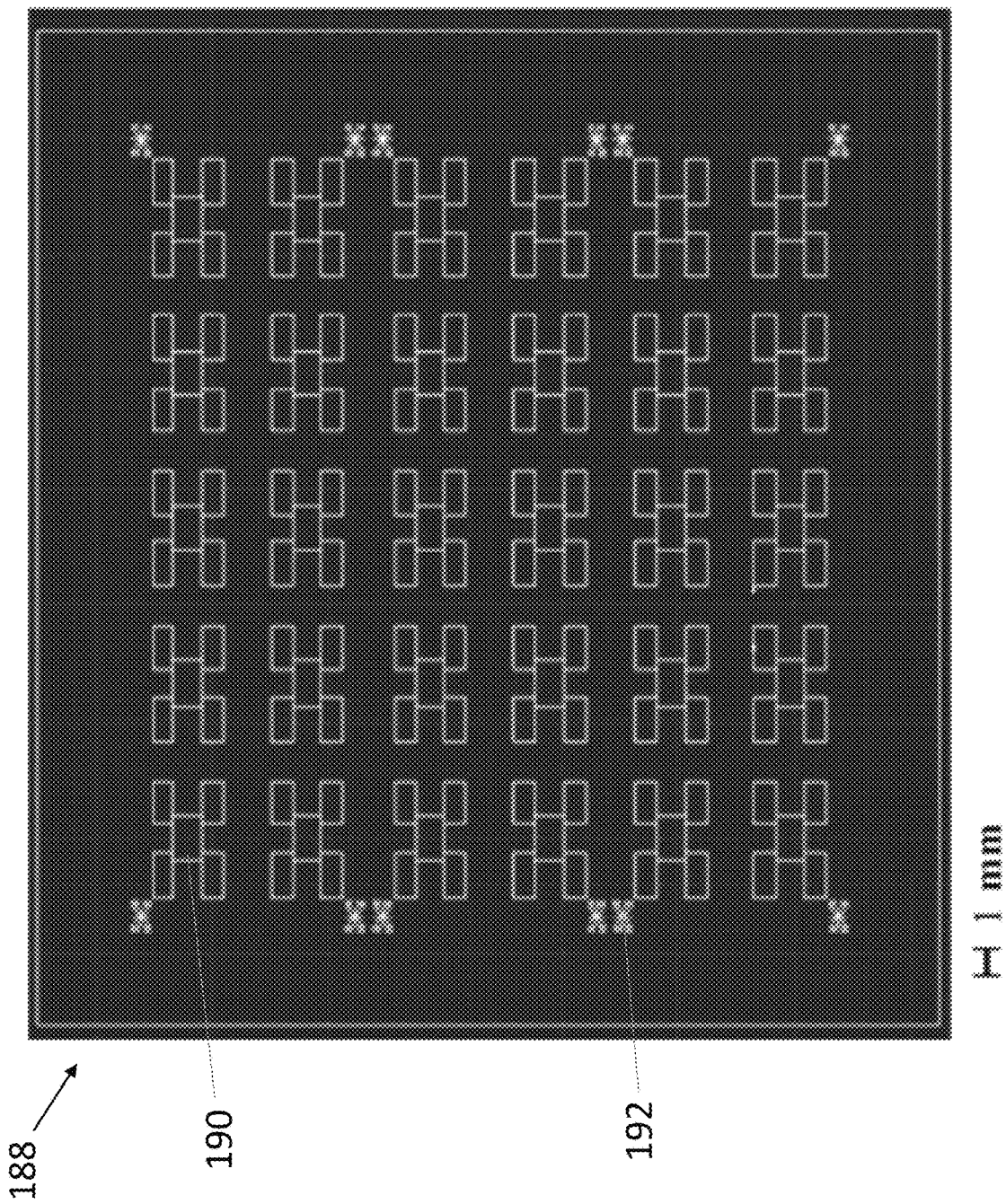
FIG. 11 illustrates a mask design for laser micromachining of a substrate of a MEMS structure according to one embodiment.
Figure 12:
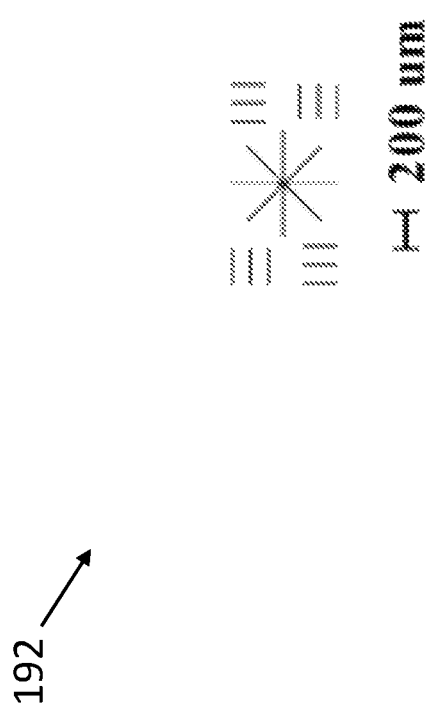
FIG. 12 illustrates an alignment marker of the mask design of FIG. 11.

Referring to FIGS. 11 and 12, a laser micromachining mask is shown generally at 188, and includes white lines corresponding to a designed path for the laser cut. The mask 188 includes island cutouts, such as island cutout 190, and alignment markers, such as alignment marker 192.

Using the mask 188, "islands" of substrate isolated from the rest of the substrate were created by laser cutting along their borders. Each island corresponded to an in-plane SU-8 MEMS structure on the copper surface. For each "island", the laser only needs to ablate the polyimide layer. At the corners of the island cutouts, the alignment markers were designed to help with alignment during the lithography on the copper surface. For these alignment markers, the laser must penetrate both the polyimide and the copper layers, to make the alignment markers visible on the copper surface.

Figure 13:
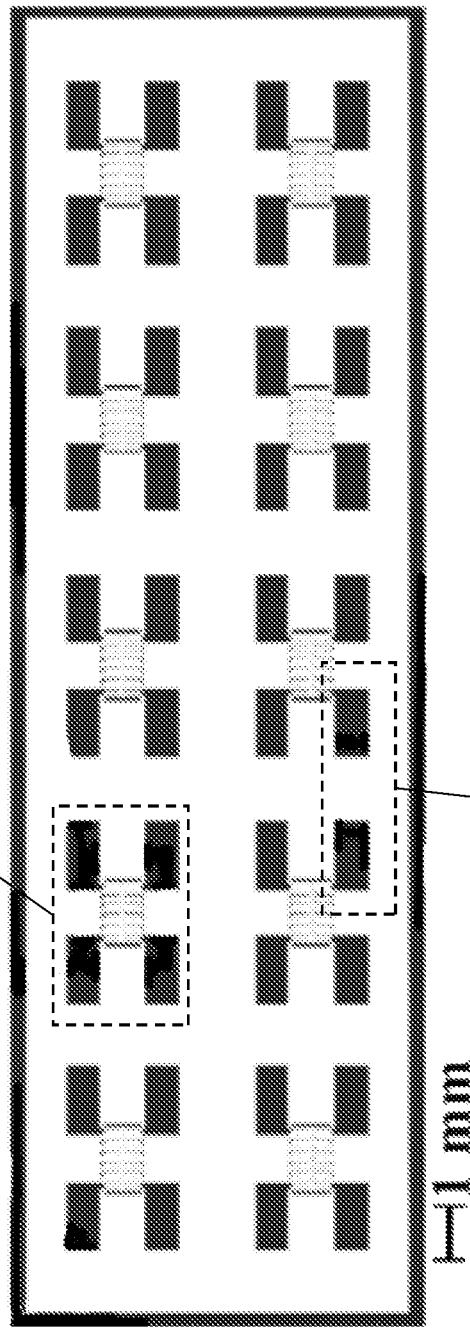
FIG. 13 illustrates a mask design for lithography of a structural layer of the MEMS structure of FIG. 11.
Figure 14:
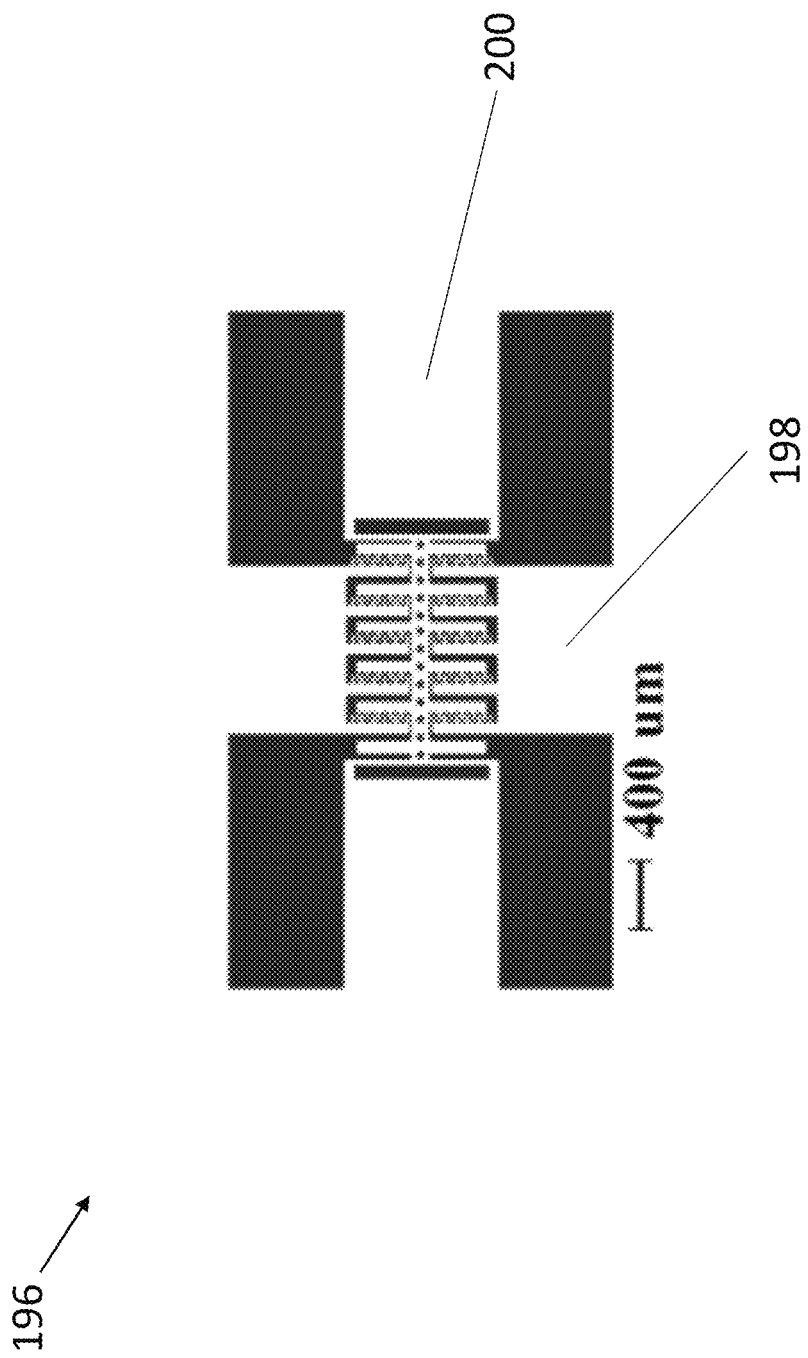
FIG. 14 is a fragmentary view of a single MEMS structure of the mask design of FIG. 13.
Figure 15:
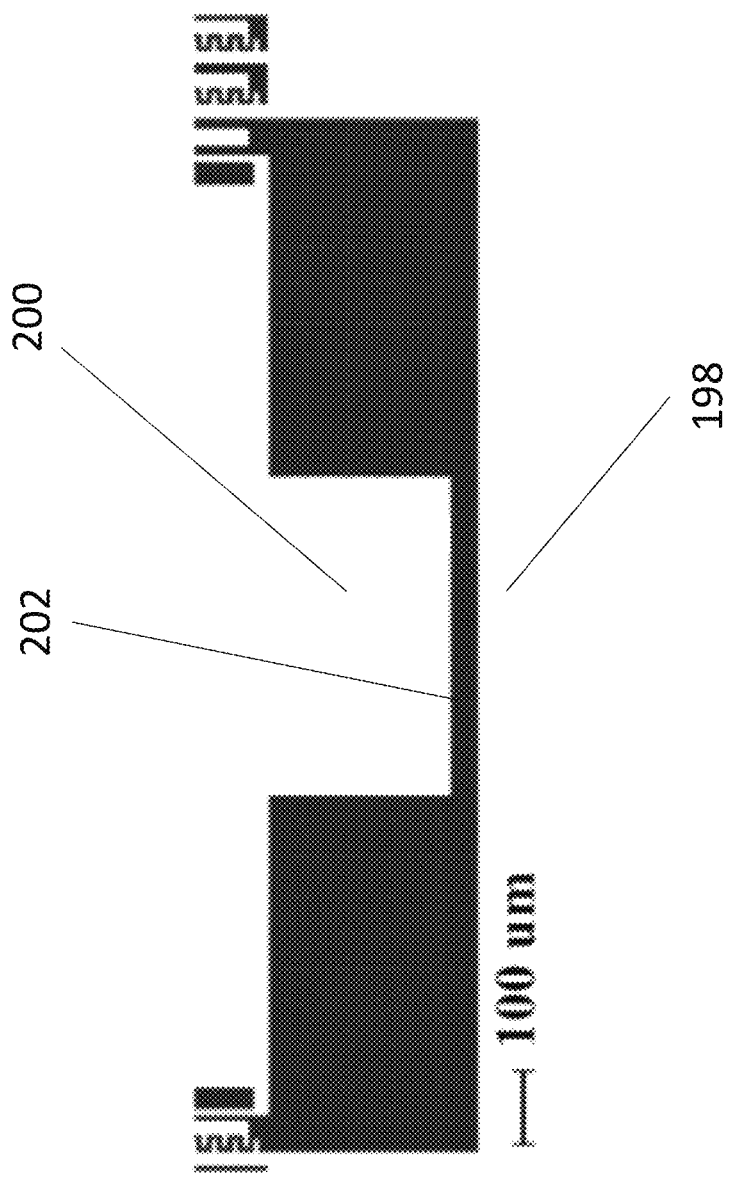
FIG. 15 is a fragmentary view of an electrode separation gap of the mask design of FIG. 13.

Referring to FIGS. 13 to 15, a lithography mask for the SU-8 MEMS structures is shown generally at 194. A mask for a single MEMS structure is shown generally at 196 in FIG. 14, and includes an implementation of area-varying comb drives ensuring electro-mechanical coupling, a ground electrode 198, and a transducer electrode 200. Release holes were spaced by 100 µm from each other on the movable parts. As shown in FIG. 15, a 50 µm separation gap 202 was designed between the ground electrode 198 and the transducer electrode 200 in order to avoid electrical short-circuits between different electrodes.

Using the masks in FIGS. 11 to 15, two batch fabrication iterations were processed, and a total of 60 in-plane capacitive MEMS test structures were fabricated.

For laser micromachining using the mask 188, the relative output power was kept at 85%, and the laser speed at 1 mm/s. The laser cut was repeated 7 times to create polyimide "islands" isolated from the rest of the substrate, while for the drilling of alignment markers, the laser cut was repeated 14 times.

For SU-8 lithography using the mask 194, an exposure time of 7.5 s (75 mJ/cm$^2$ according to labelled intensity of 10 mW/cm$^2$) was selected, based on the calibration results of Example 2. Other lithography process parameters used were those in Table 1. In order to carry out a spin-coating process for 75 µm SU-8 2050, the polyimide sheet was fixed on a 4-inch silicon wafer by Kapton™ tape.

The MEMS test structures were released by immersion in copper etchant purchased from MG Chemicals (labeled etch rate: 4.4 to 5 µm/min) for 5 hours.

A 200 nm aluminum conformal metal conductive layer was deposited onto the structures by tilted magnetron sputtering using an AJA™ thin film deposition system (AJA International Inc., North Scituate, MA, USA). A tilting angle of 11.3° was used.

CONCLUSION

Although specific embodiments have been described and illustrated, such embodiments should be considered illustrative only and not as limiting the invention as construed according to the accompanying claims.

The invention claimed is:

1. A method of fabricating a micro electro-mechanical systems (MEMS) structure, the method comprising:
   causing an etchant to remove a portion of a sacrificial layer of the MEMS structure, the sacrificial layer between a structural layer of the MEMS structure and a substrate of the MEMS structure, wherein causing the etchant to remove the portion of the sacrificial layer comprises causing a target portion of the substrate to be removed from the MEMS structure.

2. The method of claim 1 further comprising removing at least part of a thickness of a border portion of the substrate before causing the etchant to remove the portion of the sacrificial layer, the border portion of the substrate adjacent to the target portion of the substrate.

3. A method of fabricating a micro electro-mechanical systems (MEMS) structure, the method comprising:
   causing an etchant to remove a portion of a sacrificial layer of the MEMS structure, the sacrificial layer between a structural layer of the MEMS structure and a substrate of the MEMS structure, wherein causing the etchant to remove the portion of the sacrificial layer comprises causing a target portion of the substrate to be released from the MEMS structure; and
   removing at least part of a thickness of a border portion of the substrate before causing the etchant to remove the portion of the sacrificial layer, the border portion of the substrate adjacent to the target portion of the substrate;
   wherein removing at least part of the thickness of the border portion of the substrate comprises removing all of the border portion of the substrate.

4. The method of claim 3 wherein only the sacrificial layer connects the target portion of the substrate to the MEMS structure after removing all of the border portion of the substrate and before causing the etchant to remove the portion of the sacrificial layer.

5. The method of claim 2 wherein the border portion of the substrate surrounds the target portion of the substrate.

6. The method of claim 2 wherein removing the border portion of the substrate comprises causing a laser to remove the border portion of the substrate.

7. The method of claim 1 further comprising depositing the structural layer onto the sacrificial layer.

8. The method of claim 2 further comprising depositing the structural layer onto the sacrificial layer after removing the at least part of the thickness of the border portion of the substrate and before causing the etchant to remove the portion of the sacrificial layer.

9. The method of claim 1 further comprising removing a portion of the structural layer.

10. The method of claim 9 wherein:
    the structural layer comprises a photosensitive polymer; and
    removing the portion of the structural layer comprises using photolithography to remove the portion of the structural layer.

11. The method of claim 1 wherein:
    the etchant comprises water; and
    the structural layer and the substrate include hydrophobic surfaces.

12. The method of claim 9 wherein removing the portion of the structural layer comprises removing the portion of the structural layer without removing an active portion of the structural layer, the active portion comprising a microstructure movable relative to the substrate.

13. A method of fabricating a micro electro-mechanical systems (MEMS) structure, the method comprising:
    causing an etchant comprising water to remove a portion of a sacrificial layer of the MEMS structure, the sacrificial layer between a structural layer of the MEMS structure and a substrate of the MEMS structure, wherein the structural layer and the substrate include hydrophobic surfaces;
    wherein removal of the portion of the sacrificial layer creates a structural layer overhang resulting from etching between the structural layer and the substrate that is limited by hydrophobicity of the structural layer and the substrate.

14. The method of claim 13 further comprising depositing a conductive layer onto the structural layer after causing the etchant to remove the portion of the sacrificial layer.

15. The method of claim 14 wherein depositing the conductive layer onto the structural layer comprises tilted magnetron sputtering.

16. The method of claim 14 wherein depositing the conductive layer onto the structural layer comprises depositing the conductive layer onto the structural layer such that a covered part of an inner surface of the substrate exposed during removal of the sacrificial layer is masked from metal deposition by the structural layer overhang, creating a break in the conductive layer.

17. The method of claim 16 wherein:
    the structural layer is an electrical insulator; and
    the break in the conductive layer creates an open circuit.

18. The method of claim 13 further comprising removing a portion of the structural layer without removing an active portion of the structural layer, the active portion comprising a microstructure movable relative to the substrate.

19. The method of claim 13 wherein: the contact angle of water on the structural layer is at least 90 degrees; the contact angle of water on the substrate is at least 80 degrees; and the sacrificial layer has a thickness of about 25 microns.

20. The method of claim 1 wherein the substrate comprises a flexible material.

21. The method of claim 1 wherein the substrate comprises polyimide.

\* \* \* \* \*